(12) United States Patent
Lin et al.

(10) Patent No.: US 10,655,828 B2
(45) Date of Patent: May 19, 2020

(54) LED PACKAGE STRUCTURE

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Chen-Hsiu Lin, New Taipei (TW); Ming-Kun Weng, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/273,628

(22) Filed: Feb. 12, 2019

(65) Prior Publication Data

US 2020/0041111 A1    Feb. 6, 2020

(30) Foreign Application Priority Data

Aug. 1, 2018    (TW) .............................. 107126706 A

(51) Int. Cl.
*F21V 23/00*     (2015.01)
*H01L 33/62*     (2010.01)
*H01L 27/15*     (2006.01)

(52) U.S. Cl.
CPC .......... *F21V 23/006* (2013.01); *F21V 23/008* (2013.01); *H01L 27/156* (2013.01); *H01L 33/62* (2013.01)

(58) Field of Classification Search
CPC .... F21V 23/006; F21V 23/008; H01L 27/156; H01L 33/62
See application file for complete search history.

(56) References Cited

U.S. PATENT DOCUMENTS

| | | | | |
|---|---|---|---|---|
| 6,060,729 A | * | 5/2000 | Suzuki | H01L 24/06 257/99 |
| 6,376,902 B1 | * | 4/2002 | Arndt | H01L 33/486 257/100 |
| 7,009,285 B2 | * | 3/2006 | Su | H01L 33/486 257/100 |
| 7,282,740 B2 | * | 10/2007 | Chikugawa | H01L 33/60 257/103 |

(Continued)

*Primary Examiner* — Alexander K Garlen
*Assistant Examiner* — Christopher E Dunay
(74) *Attorney, Agent, or Firm* — Li & Cai Intellectual Property (USA) Office

(57) ABSTRACT

An LED package structure includes an LED frame, a driver frame unit, a housing, LED chips, a driver chip, and a light-permeable package body. The LED frame includes a carrying segment and two bent leads connected to the carrying segment. The driver frame unit includes two side frames each having a functional segment and a bent lead. The housing has a cavity exposing the carrying segment and the two functional segments. The bent leads protrude from a lateral surface of the housing, and curvedly extend to a bottom surface of the housing. The LED chips are mounted on the carrying segment. The driver chip is fixed to one of the two functional segments, and is electrically connected to the other functional segment and the LED chips. The light-permeable package body is filled in the cavity so as to embed the LED chips and the driver chip.

20 Claims, 9 Drawing Sheets

(56) References Cited

U.S. PATENT DOCUMENTS

| | | | | |
|---|---|---|---|---|
| 7,528,414 B2* | 5/2009 | Huang | H01L 33/483 | 257/100 |
| 7,635,915 B2* | 12/2009 | Xie | H01L 33/62 | 257/692 |
| 7,675,145 B2* | 3/2010 | Wong | H01L 33/486 | 257/676 |
| 8,097,937 B2* | 1/2012 | Bogner | H01L 33/642 | 257/100 |
| 8,101,955 B2* | 1/2012 | Keh | H01L 33/486 | 257/433 |
| 8,692,282 B2* | 4/2014 | Kim | H01L 33/62 | 257/99 |
| 8,823,041 B2* | 9/2014 | Kim | H01L 33/62 | 257/99 |
| 8,860,066 B2* | 10/2014 | Mineshita | H01L 33/486 | 257/99 |
| 9,112,129 B2* | 8/2015 | An | H01L 33/647 | |
| 2004/0046242 A1* | 3/2004 | Asakawa | H01L 31/0203 | 257/678 |
| 2004/0208210 A1* | 10/2004 | Inoguchi | H01L 33/56 | 372/36 |
| 2004/0256706 A1* | 12/2004 | Nakashima | H01L 23/49562 | 257/678 |
| 2005/0139846 A1* | 6/2005 | Park | H01L 33/62 | 257/98 |
| 2005/0179376 A1* | 8/2005 | Fung | H01L 33/58 | 313/512 |
| 2006/0289812 A1* | 12/2006 | Wu | H01L 25/167 | 250/551 |
| 2008/0151143 A1* | 6/2008 | Li | G02F 1/133603 | 349/68 |
| 2009/0072251 A1* | 3/2009 | Chan | H01L 25/0753 | 257/89 |
| 2009/0283781 A1* | 11/2009 | Chan | H01L 25/0753 | 257/89 |
| 2010/0155748 A1* | 6/2010 | Chan | H01L 33/62 | 257/89 |
| 2011/0180804 A1* | 7/2011 | Su | H05B 45/00 | 257/76 |
| 2011/0248293 A1* | 10/2011 | Chan | H01L 25/0753 | 257/89 |
| 2012/0025227 A1* | 2/2012 | Chan | H01L 33/62 | 257/89 |
| 2012/0104426 A1* | 5/2012 | Chan | H01L 25/0753 | 257/89 |
| 2012/0307481 A1* | 12/2012 | Joo | H01L 33/60 | 362/97.1 |
| 2013/0113003 A1* | 5/2013 | Ke | H01L 25/0753 | 257/89 |
| 2014/0071689 A1* | 3/2014 | Yoon | H01L 33/60 | 362/296.01 |
| 2014/0071700 A1* | 3/2014 | Yoon | F21V 21/00 | 362/382 |
| 2014/0239321 A1* | 8/2014 | Lu | H01L 25/167 | 257/89 |
| 2015/0014722 A1* | 1/2015 | Lin | H01L 33/483 | 257/98 |
| 2015/0034986 A1* | 2/2015 | Lee | H01L 27/15 | 257/98 |
| 2015/0117007 A1* | 4/2015 | Chang | F21V 19/004 | 362/249.02 |
| 2015/0294959 A1* | 10/2015 | Lee | H01L 25/0753 | 257/89 |
| 2016/0095184 A1* | 3/2016 | Nakabayashi | H05B 33/22 | 313/503 |
| 2016/0120003 A1* | 4/2016 | Chen | H05B 33/12 | 313/503 |
| 2016/0260877 A1* | 9/2016 | Chen | H01L 33/62 | |
| 2018/0004040 A1* | 1/2018 | Kuramoto | H01L 25/0753 | |
| 2018/0114875 A1* | 4/2018 | Ho | A61B 5/0261 | |

* cited by examiner

LED PACKAGE STRUCTURE

CROSS-REFERENCE TO RELATED PATENT APPLICATION

This application claims the benefit of priority to Taiwan Patent Application No. 107126706, filed on Aug. 1, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a light emitting diode (LED) package structure.

BACKGROUND OF THE DISCLOSURE

When a conventional LED package structure includes a plurality of LED chips arranged inside thereof, the LED chips need to be electrically connected to an external driver chip, so that the LED chips can be controlled by the external driver chip. Accordingly, the design of the conventional LED package structure is limited to the external driver chip.

SUMMARY OF THE DISCLOSURE

In response to the above-referenced technical inadequacies, the present disclosure provides an LED package structure to effectively improve the issues associated with conventional LED package structures.

In one aspect, the present disclosure provides an LED package structure, which includes an LED frame, a driver frame unit, a housing, a plurality of LED chips, a driver chip, and a light-permeable package body. The LED frame includes a carrying segment and two bent leads connected to the carrying segment. The driver frame unit is arranged apart from the LED frame and includes two side frames. Each of the two side frames includes a functional segment, an extending segment connected to the functional segment, and a bent lead connected to the extending segment. The housing includes a top surface, a bottom surface, and a plurality of lateral surfaces that are connected to the top surface and the bottom surface. The housing has a cavity recessed in the top surface thereof, and the carrying segment and the two functional segments are exposed from the cavity. The two bent leads of the LED frame and the two bent leads of the driver frame unit protrude from the housing by passing through one of the lateral surfaces, and curvedly extend to the bottom surface. The LED chips are arranged in the cavity. The LED chips are fixed to and electrically connected to the carrying segment. The driver chip is arranged in the cavity. The driver chip is fixed to one of the two functional segments, and is electrically connected to the other functional segment by wires. The LED chips are electrically connected to the driver chip by wires, so that the driver chip is configured to drive the LED chips to emit light. The light-permeable package body is filled in the cavity. The LED chips and the driver chip are embedded in the light-permeable package body.

Therefore, the LED package structure of the present disclosure is provided with a driver chip arranged therein for driving the LED chips, so that the LED package structure is not limited to an external driver chip. Moreover, each of the bent leads protrudes from the housing by passing through one of the lateral surfaces, and curvedly extends to the bottom surface of the housing, so that the LED package structure can be used to emit light along a side-view direction or a front-view direction according to user requirements.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
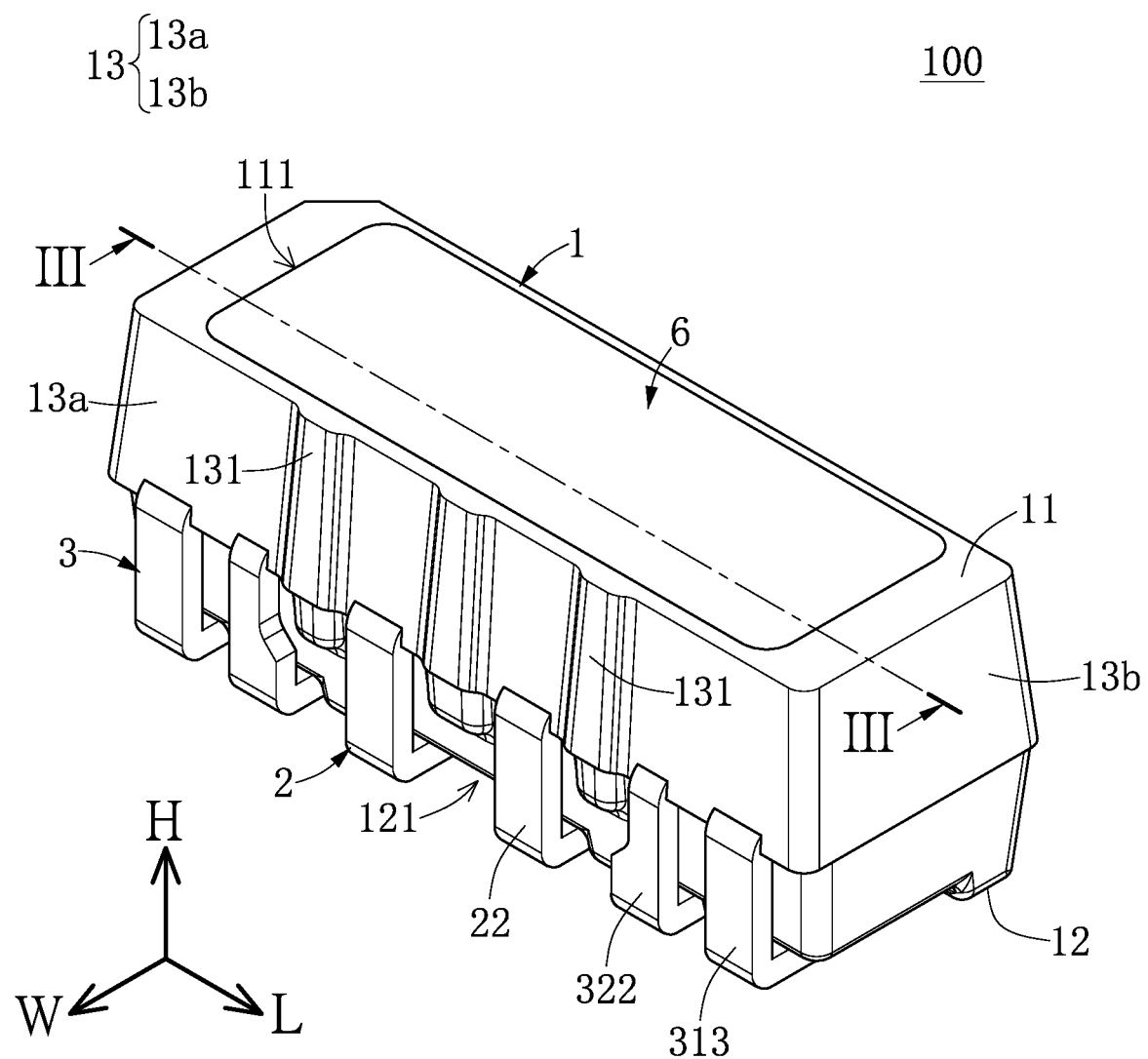
FIG. 1 is a perspective view of an LED package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
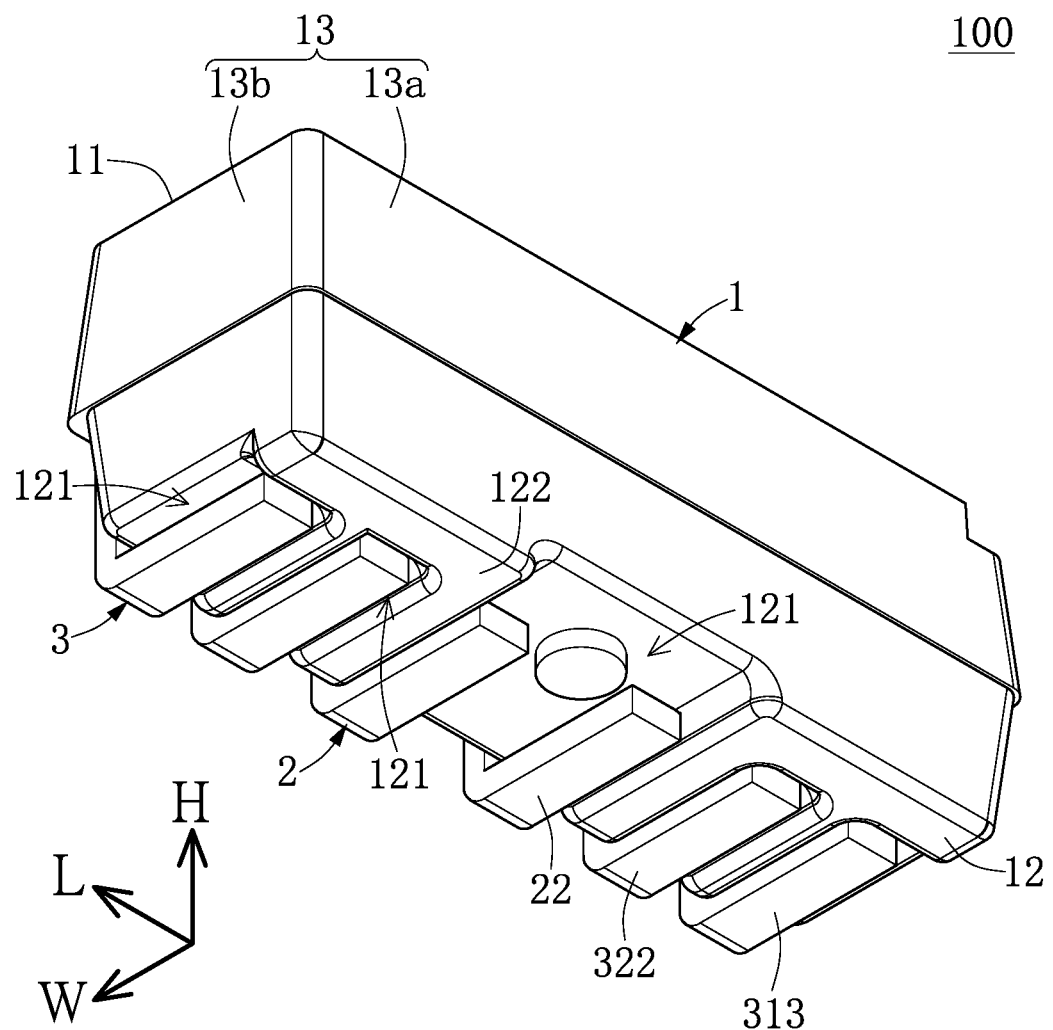
FIG. 2 is a perspective view of the LED package structure from another angle of view.
Figure 3:
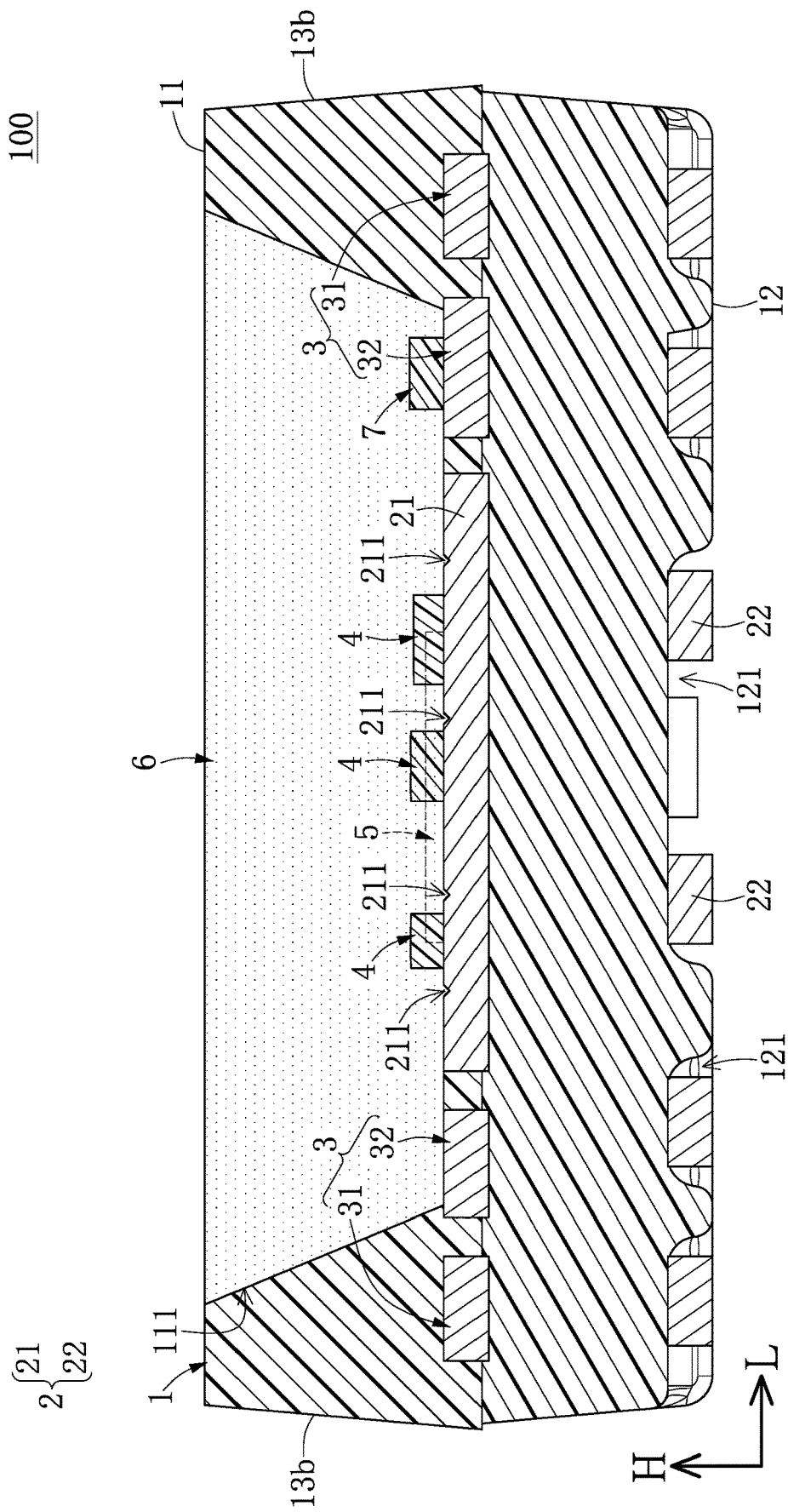
FIG. 3 is a cross-sectional view taken along line III-III of FIG. 1.

Referring to FIG. 1 to FIG. 9, an embodiment of the present disclosure provides an LED package structure 100. As shown in FIG. 1 to FIG. 3, the LED package structure 100 includes a housing 1, an LED frame 2 and a sub-frame unit 3 both fixed to the housing 1 and arranged apart from each other, a plurality of LED chips 4 disposed on the LED frame 2, a driver chip 5 (e.g., an IC) disposed on the sub-frame unit 3, and a light-permeable package body 6 packaging the LED chips 4 and the driver chip 5. In addition, the LED package structure 100 can further include a Zener 7 fixed to the sub-frame unit 3 and embedded in the light-permeable package body 6. It should be noted that, the LED package structure 100 can include or exclude the driver chip 5, and when the LED package structure 100 includes the driver chip 5, the sub-frame unit 3 can be regarded as a driver frame unit 3. Moreover, the following description only describes an embodiment that is related to the LED package structure 100 including the driver chip 5. The following description discloses the structure and connection relationships of each component of the LED package structure 100.

Figure 4:
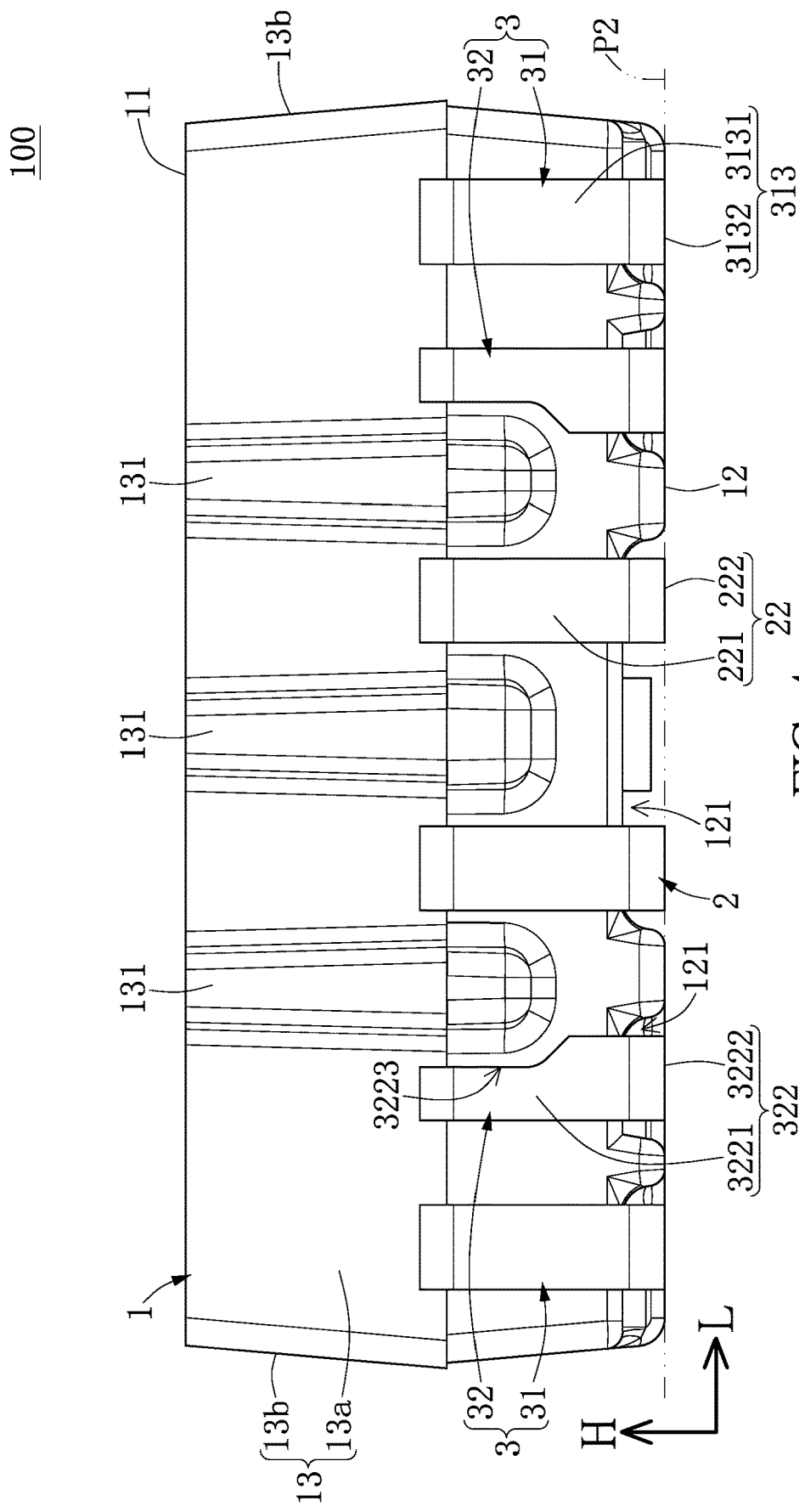
FIG. 4 is a left side view of FIG. 1.
Figure 5:
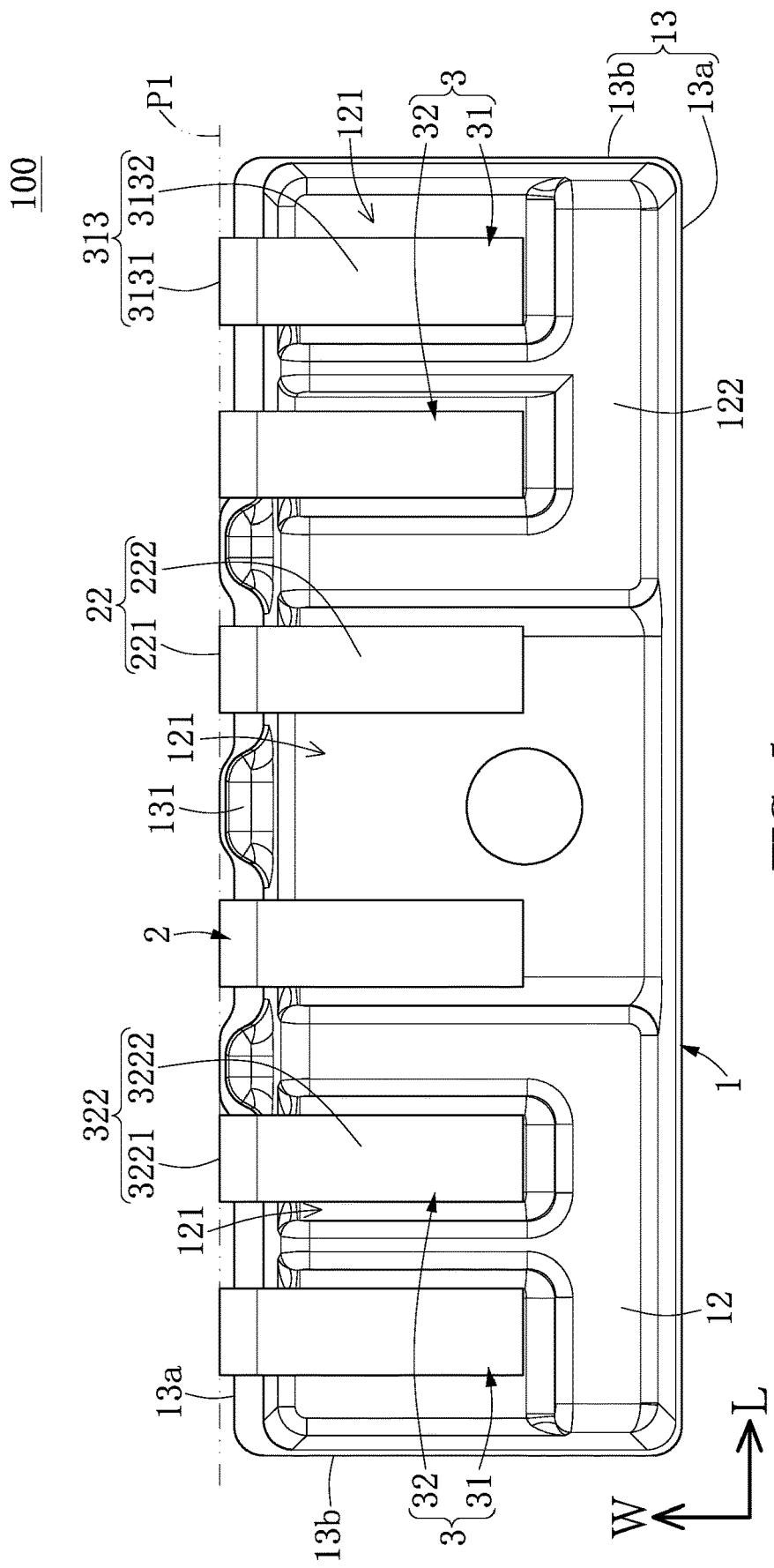
FIG. 5 is a bottom view of FIG. 1.
Figure 6:
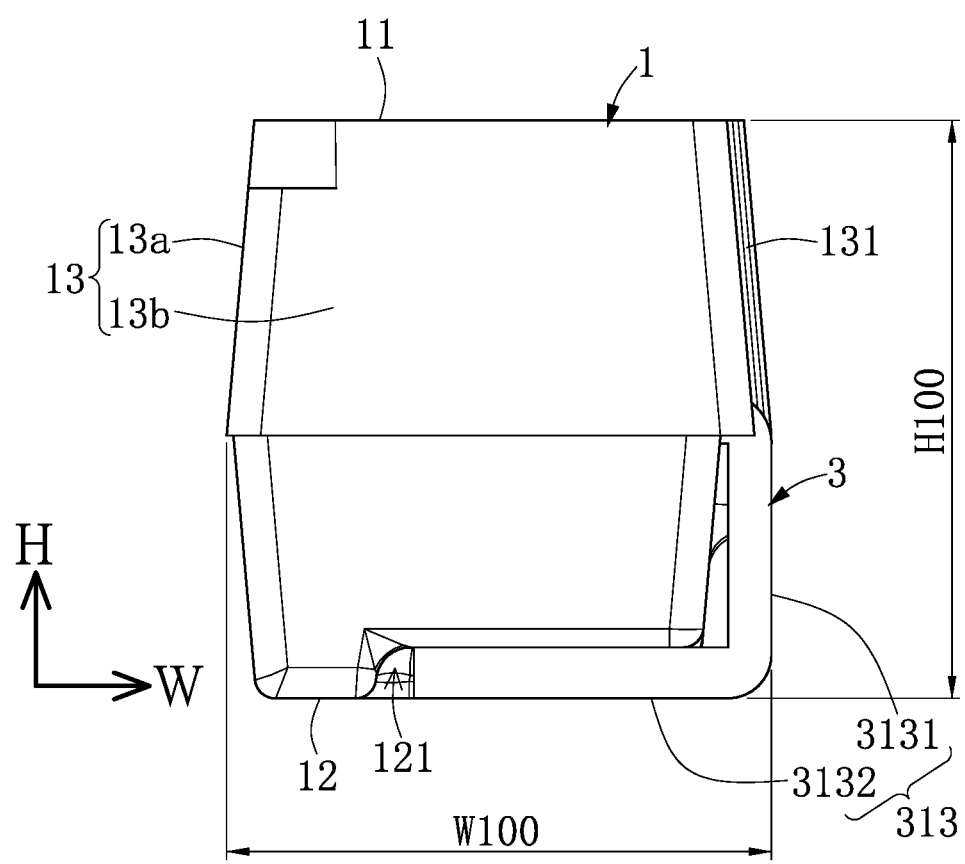
FIG. 6 is a rear view of FIG. 1.

As shown in FIG. 4 to FIG. 6, the housing 1 is approximately a cuboid and defines a longitudinal direction L, a width direction W, and a thickness direction H, which are orthogonal to each other. The housing 1 includes a top surface 11, a bottom surface 12, and a plurality of lateral surfaces 13 that are connected to the top surface 11 and the bottom surface 12. The lateral surfaces 13 in the present embodiment include two board lateral surfaces 13a and two narrow lateral surfaces 13b, but the present disclosure is not limited thereto.

Specifically, the housing 1 has a cavity 111 recessed in the top surface 11 (as shown in FIG. 3) thereof, and the cavity 111 is in an elongated shape substantially parallel to the longitudinal direction L. In other words, the longitudinal direction L can be defined by the cavity 111. As shown in FIG. 4, the housing 1 includes a plurality of elongated protrusions 131 arranged on one of the lateral surfaces 13 (i.e., one of the two board lateral surfaces 13a) and arranged apart from each other. Each of the protrusions 131 extends from the top surface 11 toward the bottom surface 12, and is apart from the bottom surface 12 by a distance. A width of each of the protrusions 131 in the longitudinal direction L gradually increases along a direction from the top surface 11 to the bottom surface 12.

Moreover, as shown in FIG. 5, the housing 1 has a plurality of recesses 121 formed in the bottom surface 12 thereof, and one side of each of the recesses 121 is in spatial communication with the lateral surface 13 that is formed with the protrusions 131. In other words, the recesses 121 in the present embodiment are substantially arranged in a row along the longitudinal direction L, and the outer two recesses 121 are respectively in spatial communication with the two narrow lateral surfaces 13b.

As shown in FIG. 4 and FIG. 5 of the present embodiment, the bottom surface 12 of the housing 1 is formed with two F-shaped supporting ribs 122 by the recesses 121, and the two F-shaped supporting ribs 122 are arranged apart from each other. In other words, the middle recess 121 between the two F-shaped supporting ribs 122 is in spatial communication with the two board lateral surfaces 13a, but the present disclosure is not limited thereto. Portions of the two F-shaped supporting ribs 122 arranged adjacent to each other respectively correspond in position to (or are arranged under) the outer two protrusions 131 along the thickness direction H.

Figure 7:
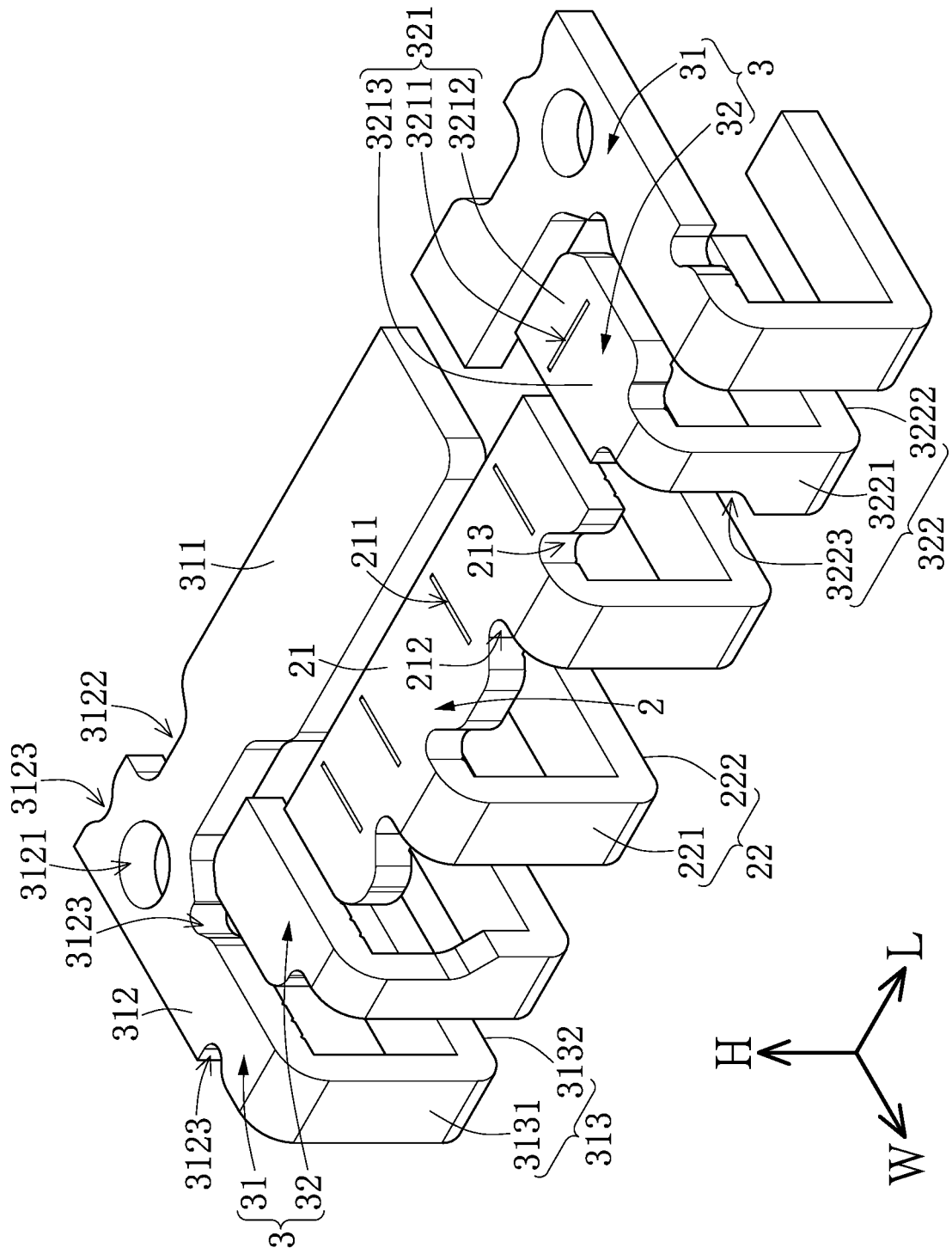
FIG. 7 is a perspective view showing an LED frame and a driver frame unit of the LED package structure.
Figure 8:
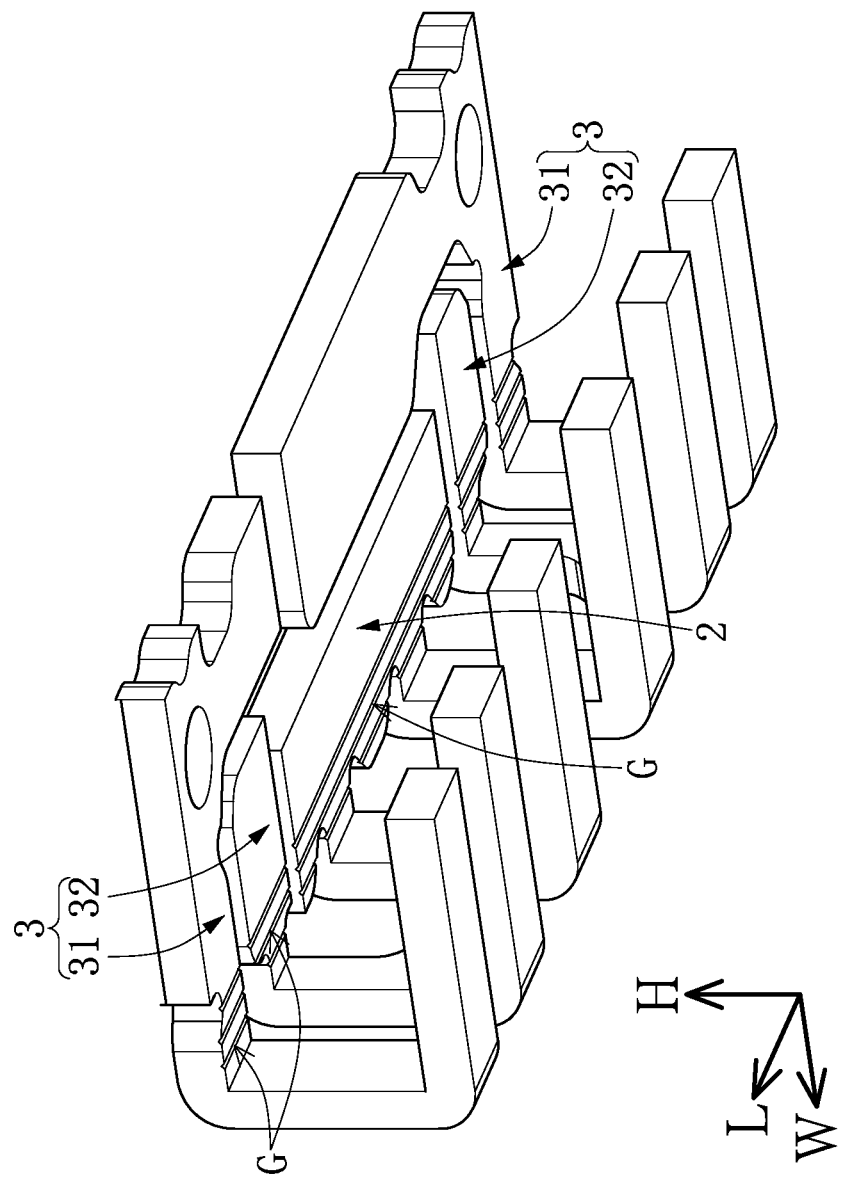
FIG. 8 is a perspective view of the LED frame and the driver frame unit from another angle of view.

As shown in FIG. 7 and FIG. 8, the LED frame 2 in the present embodiment is integrally formed as a one-piece structure, and includes a carrying segment 21 and two bent leads 22 connected to the carrying segment 21. The carrying segment 21 is in an elongated shape parallel to the longitudinal direction L. The two bent leads 22 are spaced apart from each other, and have the same polarity.

Figure 9:
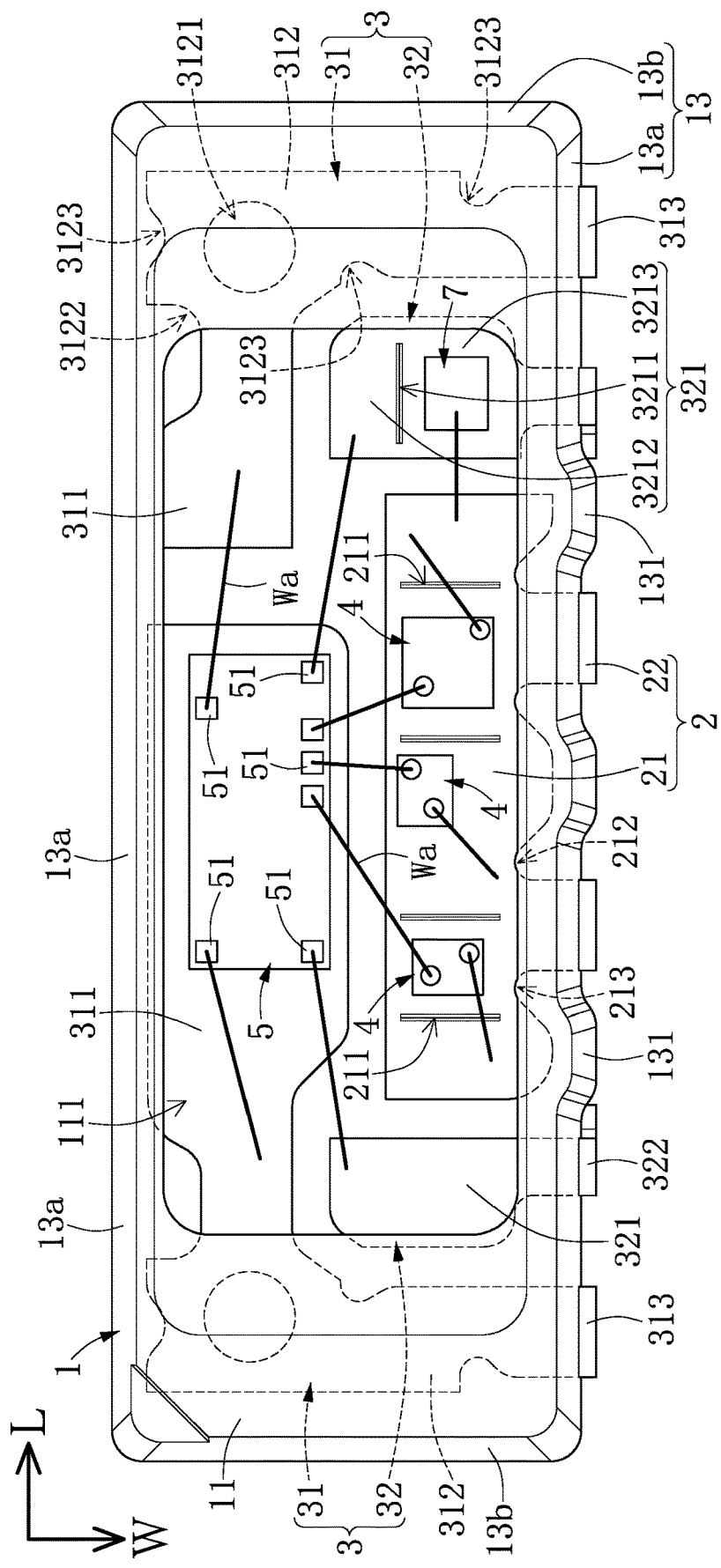
FIG. 9 is a top view of FIG. 1 when a light-permeable package body is omitted.

Specifically, as shown in FIG. 7 and FIG. 9, the carrying segment 21 is embedded in the housing 1, and at least part of a surface of the carrying segment 21 is exposed from the cavity 111. The at least part of the surface of the carrying segment 21 exposed from the cavity 111 is arranged on a bottom of the cavity 111, and a plurality of blocking grooves 211 are recessed in the at least part of the surface of the carrying segment 21. In the present embodiment, each of the blocking grooves 211 has the same length that is in a direction parallel to the width direction W, but the present disclosure is not limited thereto.

Moreover, the carrying segment 21 has two inner notches 212 recessed in an edge thereof between the two bent leads 22 of the LED frame 2, the two inner notches 212 are respectively arranged adjacent to the two bent leads 22 of the LED frame 2, and each of the inner notches 212 is fully filled with the housing 1. In the present embodiment, the carrying segment 21 has two outer notches 213 recessed in edges thereof arranged at two opposite outer sides of the two bent leads 22 of the LED frame 2, the two outer notches 213 are respectively arranged adjacent to the two bent leads 22 of the LED frame 2, and each of the outer notches 213 is fully filled with the housing 1. Accordingly, since the LED frame 2 is formed with the inner notches 212 and the outer notches 213, the combining strength between the LED frame 2 and the housing 1 can be increased, and the LED package structure 100 can be capable of preventing steam from permeating into the housing 1.

As shown in FIG. 1, FIG. 4, and FIG. 5, the two bent leads 22 of the LED frame 2 protrude from the housing 1 by passing through one of the lateral surfaces 13 (i.e., the board lateral surface 13a formed with the protrusions 131), and curvedly extend to the bottom surface 12 of the housing 1. In the present embodiment, each of the two bent leads 22 of the LED frame 2 is in an L-shape and includes a side-view soldering segment 221 and a front-view soldering segment 222. The side-view soldering segment 221 of each of the bent leads 22 of the LED frame 2 is arranged adjacent to the lateral surface 13 that is penetrated by the bent leads 22, and the front-view soldering segment 222 of each of the bent leads 22 of the LED frame 2 is arranged adjacent to the bottom surface 12 of the housing 1.

Specifically, the two side-view soldering segments 221 of the LED frame 2 are provided with one of the protrusions 131 there-between, and the other two protrusions 131 are respectively located at two opposite outer sides of the two side-view soldering segments 221 of the LED frame 2. Moreover, since the middle recess 121 between the two F-shaped supporting ribs 122 is in spatial communication with the lateral surface 13 that is penetrated by the bent leads 22 of the LED frame 2, the two front-view soldering segments 222 of the LED frame 2 can be arranged in the middle recess 121 between the two F-shaped supporting ribs 122.

As shown in FIG. 7 and FIG. 9, the driver frame unit 3 includes two side frames 31 and two conductive frames 32, the two side frames 31 are respectively arranged at two opposite outer sides of the LED frame 2, and the LED frame 2 and each of the two side frames 31 are provided with one of the two conductive frames 32 there-between. Each of the two side frames 31 includes a functional segment 311, an extending segment 312 connected to the functional segment 311, and a bent lead 313 connected to the extending segment 312.

It should be noted that, the extending segment 312 and the bent lead 313 of one of the two side frames 31 in the present embodiment is substantially mirror symmetrical to that of the other side frame 31, and the functional segments 311 of the two side frames 31 have different structures. Specifically, the functional segment 311 of one of the two side frames 31 has a longer length for bonding the driver chip 5, and the functional segment 311 of the other side frame 31 has a shorter length for wiring the driver chip 5.

The extending segments 312 of the two side frames 31 are entirely embedded in the housing 1, and are respectively arranged adjacent to the two narrow lateral surfaces 13b of the housing 1. Moreover, each of the two side frames 31 of the LED package structure 100 in the present embodiment is preferably formed with the following features, thereby increasing the combining strength between the side frames 31 and the housing 1 and effectively preventing steam from permeating into the housing 1.

The functional segment 311 and the extending segment 312 of the side frame 31 are jointly formed as an L-shape structure, the extending segment 312 has a thru-hole 3121 recessed in a corner of the L-shaped structure, and the thru-hole 3121 is fully filled with the housing 1. A U-shaped slot 3122 is recessed in an edge of the functional segment 311 and an edge of the extending segment 312, the U-shaped slot 3122 is fully filled with the housing 1, and a part of the U-shaped slot 3122 and a part of the housing 1 filled therein are arranged on the bottom of the cavity 111. The extending segment 312 has a plurality of dents 3123 recessed in edges thereof and respectively facing different directions, and the dents 3123 are fully filled with the housing 1.

The functional segments 311 of the two side frames 31 respectively extend from the two extending segments 312 toward each other along the longitudinal direction L, the functional segment 311 of each of the two side frames 31 is partially embedded in the housing 1, and a partial surface of the functional segment 311 of each of the two side frames 31 is exposed from the cavity 111. In other words, the partial surface of the functional segment 311 of each of the two side frames 31 exposed from the cavity 111 is arranged on the bottom of the cavity 111. The functional segment 311 used for bonding the driver chip 5 has a length larger than 50% of a length of the bottom of the cavity 111. The extending direction of the functional segments 311 of the two side frames 31 is substantially parallel to the carrying segment 21 of the LED frame 2.

As shown in FIG. 1, FIG. 4, and FIG. 5, the bent leads 313 of the two side frames 31 protrude from the housing 1 by passing through one of the lateral surfaces 13 (i.e., the board lateral surface 13a formed with the protrusions 131), and curvedly extend to the bottom surface 12 of the housing 1. In the present embodiment, the extending segment 312 and the bent lead 313 of each of the two side frames 31 are jointly formed in a substantial U-shape. That is to say, the bent lead 313 of each of the two side frames 31 is in an L-shape and includes a side-view soldering segment 3131 and a front-view soldering segment 3132. The side-view soldering segment 3131 of the bent lead 313 of each of the side frames 31 is arranged adjacent to the lateral surface 13 that is penetrated by the bent leads 313, and the front-view soldering segment 3132 of the bent lead 313 of each of the side frames 31 is arranged adjacent to the bottom surface 12 of the housing 1.

Specifically, since two of the recesses 121 surrounded by the two F-shaped supporting ribs 122 and arranged away from each other are in spatial communication with the lateral surface 13 that is penetrated by the bent leads 313 of the two side frames 31, the front-view soldering segments 3132 of the two side frames 31 can be arranged in the two recesses 121 (i.e., the outer recesses 121 shown in FIG. 5) that are surrounded by the two F-shaped supporting ribs 122 and are arranged away from each other.

As shown in FIG. 7 and FIG. 9, each of the two conductive frames 32 includes a functional segment 321 and a bent lead 322 connected to the functional segment 321. The functional segment 321 of each of the two conductive frames 32 is partially embedded in the housing 1, and a partial surface of the functional segment 321 of each of the two conductive frames 32 is exposed from the cavity 111. In other words, the partial surface of the functional segment 321 of each of the two conductive frames 32 exposed from the cavity 111 is arranged on the bottom of the cavity 111. The functional segment 321 of one of the two conductive frames 32 has a blocking groove 3211 recessed in a surface thereof, and the blocking groove 3211 can divide the corresponding functional segment 321 into a wiring portion 3212 and a die-bonding portion 3213, but the present disclosure is not limited thereto.

Specifically, the functional segments 321 of the two conductive frames 32 and the carrying segment 21 of the LED frame 2 are arranged in a row along the longitudinal direction L, and the functional segments 321 of the two conductive frames 32 are respectively located at two opposite outer sides of the carrying segment 21 of the LED frame 2. The functional segments 321 of the two side frames 32 are arranged in another row along the longitudinal direction L.

As shown in FIG. 1, FIG. 4, and FIG. 5, the bent leads 322 of the two conductive frames 32 protrude from the housing 1 by passing through one of the lateral surfaces 13 (i.e., the board lateral surface 13a formed with the protrusions 131), and curvedly extend to the bottom surface 12 of the housing 1. In the present embodiment, each of the two conductive frames 32 is formed in a substantial U-shape. That is to say, the bent lead 322 of each of the two conductive frames 32 is in an L-shape and includes a side-view soldering segment 3221 and a front-view soldering segment 3222. The side-view soldering segment 3221 of the bent lead 322 of each of the conductive frames 32 is arranged adjacent to the lateral surface 13 that is penetrated by the bent leads 322, and the front-view soldering segment 3222 of the bent lead 322 of each of the conductive frames 32 is arranged adjacent to the bottom surface 12 of the housing 1.

Specifically, each of the two bent leads 22 of the LED frame 2 and the bent lead 313 of the adjacent side frame 31 are provided with the bent lead 322 of one of the conductive frames 32 there-between. The side-view soldering segment 3221 of each of the two conductive frames 32 and the adjacent bent lead 22 of the LED frame 2 are provided with one of the protrusions 131 there-between. The bent lead 322 of each of the two conductive frames 32 has an escaping notch 3223 that receives a part of one of the protrusions 131, and the two escaping notches 3223 face each other and are respectively recessed in inner edges of the two side-view soldering segments 3221.

Moreover, since two of the recesses 121 surrounded by the two F-shaped supporting ribs 122 and arranged adjacent to each other are in spatial communication with the lateral surface 13 that is penetrated by the bent leads 322 of the two conductive frames 32, the front-view soldering segments 3222 of the two conductive frames 32 can be arranged in the two recesses 121 that are surrounded by the two F-shaped supporting ribs 122 and are arranged adjacent to each other.

In addition, as shown in FIG. 8, the two side frames 31, the LED frame 2, and the two conductive frames 32 have a plurality of grooves G recessed in surfaces thereof that are embedded in the housing 1 and face the bottom surface 12. Each of the grooves G in the present embodiment is parallel to the longitudinal direction L and includes a plurality of segments respectively distributed on the two side frames 31, the LED frame 2, and the two conductive frames 32, and the grooves G are fully filled with the housing 1. Accordingly, since the LED frame 2 and the driver frame unit 3 are formed with the grooves G, the combining strength between the LED frame 2, the driver frame unit 3, and the housing 1 can be further increased, and the LED package structure 100 can be capable of preventing steam from permeating into the housing 1.

Moreover, the relationships of the LED frame 2, the driver frame unit 3, and the housing 1 in the present embodiment can be summarized in the following description, but the present disclosure is not limited thereto. For example, in other embodiments of the present disclosure, the LED package structure 100 can be provided with part of the LED frame 2, the two side frames 31, and the conductive frames 32.

As shown in FIG. 4, FIG. 5, and FIG. 9, the carrying segment 21 of the LED frame 2 and the functional segments 311, 321 of the driver frame unit 3 are exposed from the cavity 111 of the housing 1. Each of the bent leads 22, 313, 322 protrudes from the housing 1 by passing through (a substantial middle portion of) one of the lateral surfaces 13, and curvedly extends to the bottom surface 12 of the housing 1, so that the LED package structure 100 can be used to emit light along a side-view direction or a front-view direction according to user's requirements. The protrusions 131 are arranged on the lateral surface 13 of the housing 1 that is penetrated by the bent leads 22, 313, 322.

The side-view soldering segments 221, 3131, 3221 of the bent leads 22, 313, 322 are arranged adjacent to the lateral surface 13 that is penetrated by the bent leads 22, 313, 322, and the front-view soldering segments 222, 3132, 3222 of the bent leads 22, 313, 322 are arranged adjacent to the bottom surface 12 of the housing 1. Moreover, the side-view soldering segments 221, 3131, 3221 of the bent leads 22, 313, 322 are located on a first plane P1, and protrude from or coplanar with the protrusions 131. The front-view soldering segments 222, 3132, 3222 of the bent leads 22, 313, 322 are located on a second plane P2 that is perpendicular to the first plane P1, and protrude from or coplanar with the bottom surface 12 of the housing 1. Accordingly, the LED package structure 100 can be soldered to an object (e.g., a circuit board) by the side-view soldering segments 221, 3131, 3221 or the front-view soldering segments 222, 3132, 3222.

In addition, one side of each of the recesses 121 is in spatial communication with the lateral surface 13 that is penetrated by the bent leads 22, 313, 322, and the front-view soldering segments 222, 3132, 3222 are arranged in the recesses 121. The front-view soldering segments 222 of the LED frame 2 are arranged between the two F-shaped supporting ribs 122, and the front-view soldering segment 3132, 3222 of each of the two side frame 31 and the adjacent conductive frame 32 are surrounded by one of the two F-shaped supporting ribs 122.

It should be noted that, in each of the bent leads 22, 313, 322 of the present embodiment, a length of the side-view soldering segment 221, 3131, 3221 is preferably equal to a length of the front-view soldering segment 222, 3132, 3222, but the present disclosure is not limited thereto. For example, in each of the bent leads 22, 313, 322 of other embodiments of the present disclosure, the length of the side-view soldering segment 221, 3131, 3221 can be 90-110% of the length of the front-view soldering segment 222, 3132, 3222.

As shown in FIG. 3 and FIG. 9, the LED chips 4 are arranged in the cavity 111 of the housing 1, and are fixed to and electrically connected to the carrying segment 21 of the LED frame 2. Each of the LED chips 4 in the present embodiment is disposed on a portion of the carrying segment 21 that is between any two of the blocking grooves 211 adjacent to each other. That is to say, any two of the LED chips 4 adjacent to each other are provided with one of the blocking grooves 211 there-between. Each of the LED chips 4 is electrically connected to the carrying segment 21 by a wire Wa.

The LED chips 4 in the present embodiment are respectively configured to emit a red light with a wavelength within a range of 620-630 nm, a green light with a wavelength within a range of 520-535 nm, and a blue light with a wavelength within a range of 447-472 nm, but the present disclosure is not limited thereto.

As shown in FIG. 3 and FIG. 9, the driver chip 5 is arranged in the cavity 111 of the housing 1. The driver chip 5 is fixed to the functional segment 311 of one of the two side frames 31, and is electrically connected to the functional segment 311 of the other side frame 31 and the functional segments 321 of the two conductive frames 32 by wires Wa. In the present embodiment, the driver chip 5 is also electrically connected to the functional segment 311 carrying thereto by a wire Wa, but the present disclosure is not limited thereto. Moreover, the LED chips 4 are electrically connected to the driver chip 5 by wires Wa, so that the driver chip 5 is configured to drive the LED chips 4 to emit light.

Specifically, the driver chip 5 includes a plurality of metal pads 51 that are respectively and electrically connected to the four functional segments 311, 321 and the LED chips 4 by the wires Wa. Four of the metal pads 51 respectively corresponding to the four functional segments 311, 321 are respectively located at four corners of the driver chip 5, and the other metal pads 51 respectively corresponding to the LED chips 4 are arranged on a portion of the driver chip 5 that is adjacent to the carrying segment 21, thereby preventing the wires Wa from being interlaced or too long. Accordingly, the reliability problem due to the interlaced wires Wa or the longer wires Wa can be avoided, and the wiring process of the LED package structure 100 can be more easily.

As shown in FIG. 3 and FIG. 9, the Zener 7 is fixed to the functional segment 321 of one of the two conductive frames 32. Specifically, in the functional segment 321 formed with the blocking groove 3211, the Zener 7 is mounted on the die-bonding portion 3213, and the wiring portion 3212 is electrically connected to the driver chip 5 by a wire Wa.

Moreover, the Zener 7 in the present embodiment is electrically connected to the carrying segment 21 of the LED frame 2 by a wire Wa.

As shown in FIG. 3, the light-permeable package body 6 is filled in the cavity 111 of the housing 1, and the LED chips 4, the driver chip 5, and the Zener 7 are embedded in the light-permeable package body 6. Moreover, the cavity 111 of the housing 1 in the present embodiment is fully filled with the light-permeable package body 6.

In addition, as shown in FIG. 6, the LED package structure 100 has a maximum width W100 in the width direction W and a maximum thickness H100 in the thickness direction H, and a ratio of the maximum width W100 to the maximum thickness H100 is preferably within a range of 0.8-1.2. Moreover, the LED package structure 100 has a maximum length in the longitudinal direction L, and the maximum length is at least twice of the maximum width W100 (or the maximum thickness H100). In summary, according to user's requirements, the side-view soldering segments 221, 3131, 3221 of the LED package structure 100 can be soldered to an object (e.g., a circuit board), so that the LED package structure 100 can emit light along a side-view direction; or the front-view soldering segments 222, 3132, 3222 of the LED package structure 100 can be soldered to an object, so that the LED package structure 100 can emit light along a front-view direction.

In conclusion, the LED package structure 100 of the present disclosure is provided with a driver chip 5 arranged therein for driving the LED chips 4, so that the LED package structure 100 is not limited to an external driver chip. Moreover, each of the bent leads 22, 313, 322 protrudes from the housing 1 by passing through one of the lateral surfaces 13, and curvedly extends to the bottom surface 12 of the housing 1, so that the LED package structure 100 can be used to emit light along a side-view direction or a front-view direction according to user's requirements.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED package structure, comprising:
   an LED frame including a carrying segment and two bent leads connected to the carrying segment;
   a driver frame unit arranged apart from the LED frame and including two side frames, wherein each of the two side frames includes a functional segment, an extending segment connected to the functional segment, and a bent lead connected to the extending segment;
   a housing including a top surface, a bottom surface, and a plurality of lateral surfaces that are connected to the top surface and the bottom surface, wherein the housing has a cavity recessed in the top surface thereof, and the carrying segment and the two functional segments are exposed from the cavity, and wherein the two bent leads of the LED frame and the two bent leads of the driver frame unit protrude from the housing by passing through one of the lateral surfaces, and curvedly extend to the bottom surface;
   a plurality of LED chips arranged in the cavity, wherein the LED chips are fixed to and electrically connected to the carrying segment;
   a driver chip arranged in the cavity, wherein the driver chip is fixed to one of the two functional segments, and is electrically connected to the other functional segment by wires, and wherein the LED chips are electrically connected to the driver chip by wires, so that the driver chip is configured to drive the LED chips to emit light; and
   a light-permeable package body filled in the cavity, wherein the LED chips and the driver chip are embedded in the light-permeable package body.

2. The LED package structure according to claim 1, wherein in each of the two side frames, the functional segment and the extending segment are jointly formed as an L-shaped structure, the extending segment has a thru-hole recessed in a corner of the L-shaped structure, and the thru-hole is fully filled with the housing.

3. The LED package structure according to claim 1, wherein in each of the two side frames, a U-shaped slot is recessed in an edge of the functional segment and an edge of the extending segment, the U-shaped slot is fully filled with the housing, and a part of the U-shaped slot and a part of the housing filled therein are arranged on a bottom of the cavity.

4. The LED package structure according to claim 1, wherein in each of the two side frames, the extending segment has a plurality of dents recessed in edges thereof and respectively facing different directions, and the dents are fully filled with the housing.

5. The LED package structure according to claim 1, wherein the carrying segment has two inner notches recessed in an edge thereof between the two bent leads of the LED frame, the two inner notches are respectively arranged adjacent to the two bent leads of the LED frame, and each of the inner notches is fully filled with the housing.

6. The LED package structure according to claim 1, wherein the LED frame has a plurality of blocking grooves recessed in a surface thereof exposed from the cavity, and each of the LED chips is disposed on a portion of the carrying segment that is between any two of the blocking grooves adjacent to each other.

7. The LED package structure according to claim 1, wherein the cavity is in an elongated shape defining a longitudinal direction, and the housing defines a width direction and a thickness direction both orthogonal to each other and orthogonal to the longitudinal direction, and wherein the LED package structure has a maximum width in the width direction and a maximum thickness in the thickness direction, and a ratio of the maximum width to the maximum thickness is within a range of 0.8-1.2.

8. The LED package structure according to claim 1, wherein the housing includes a plurality of elongated protrusions arranged on the lateral surface that is penetrated by the bent leads, and each of the protrusions extends from the top surface toward the bottom surface.

9. The LED package structure according to claim 8, wherein the cavity is in an elongated shape defining a longitudinal direction, and a width of each of the protrusions in the longitudinal direction gradually increases along a direction from the top surface to the bottom surface.

10. The LED package structure according to claim 1, wherein the driver frame unit includes two conductive frames, the LED frame and each of the two side frames are provided with one of the two conductive frames therebetween, and each of the two conductive frames includes a functional segment and a bent lead connected to the functional segment, and the functional segment of each of the two conductive frames is exposed from the cavity, and wherein each of the bent leads of the LED package structure protrudes from the housing by passing through one of the lateral surfaces, and curvedly extends to the bottom surface.

11. The LED package structure according to claim 10, wherein the housing includes a plurality of elongated protrusions arranged on an outer surface thereof, the bent lead of each of the two conductive frames has an escaping notch that receives a part of one of the protrusions, and the two escaping notches face each other.

12. The LED package structure according to claim 10, further comprising a Zener embedded in the light-permeable package body, wherein the Zener is fixed to the functional segment of one of the two conductive frames.

13. The LED package structure according to claim 10, wherein each of the bent leads includes a side-view soldering segment and a front-view soldering segment, the side-view soldering segment of each of the bent leads is arranged adjacent to the lateral surface that is penetrated by the bent leads, and the front-view soldering segment of each of the bent leads is arranged adjacent to the bottom surface.

14. The LED package structure according to claim 13, wherein the side-view soldering segments of the bent leads are located on a first plane, and the front-view soldering segments of the bent leads are located on a second plane that is perpendicular to the first plane.

15. The LED package structure according to claim 13, wherein the housing has a plurality of recesses formed in the bottom surface thereof, one side of each of the recesses is in spatial communication with the lateral surface that is penetrated by the bent leads, and the front-view soldering segments are arranged in the recesses.

16. The LED package structure according to claim 15, wherein the bottom surface of the housing is formed with two F-shaped supporting ribs by the recesses, the two F-shaped supporting ribs are arranged apart from each other, the front-view soldering segments of the LED frame are arranged between the two F-shaped supporting ribs, and the front-view soldering segment of each of the two side frame and the adjacent conductive frame are surrounded by one of the two F-shaped supporting ribs.

17. The LED package structure according to claim 10, wherein the driver chip includes a plurality of metal pads that are respectively and electrically connected to the four functional segments of the driver frame unit and the LED chips by wires.

18. The LED package structure according to claim 17, wherein the driver chip has four corners, and four of the metal pads respectively corresponding to the four functional segments are respectively located at the four corners.

19. The LED package structure according to claim 10, wherein the cavity is in an elongated shape defining a longitudinal direction, the two side frames, the LED frame, and the two conductive frames have a plurality of grooves recessed in surfaces thereof that are embedded in the housing and face the bottom surface, each of the grooves is parallel to the longitudinal direction and includes a plurality of segments respectively distributed on the two side frames, the LED frame, and the two conductive frames, and the grooves are fully filled with the housing.

20. The LED package structure according to claim 1, wherein the LED chips are respectively configured to emit a red light with a wavelength within a range of 620-630 nm, a green light with a wavelength within a range of 520-535 nm, and a blue light with a wavelength within a range of 447-472 nm.

\* \* \* \* \*